(12) United States Patent
Watanabe et al.

(10) Patent No.: US 8,834,817 B2
(45) Date of Patent: Sep. 16, 2014

(54) METHOD FOR REMOVING METAL IMPURITY FROM QUARTZ COMPONENT PART USED IN HEAT PROCESSING APPARATUS OF BATCH TYPE

(75) Inventors: Masahisa Watanabe, Nirasaki (JP); Katsutoshi Ishii, Nirasaki (JP); Tetsuya Shibata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 634 days.

(21) Appl. No.: 12/706,734

(22) Filed: Feb. 17, 2010

(65) Prior Publication Data

US 2010/0135877 A1 Jun. 3, 2010

Related U.S. Application Data

(63) Continuation of application No. 12/222,241, filed on Aug. 5, 2008, now abandoned.

(30) Foreign Application Priority Data

Aug. 10, 2007 (JP) .................................. 2007-210241

(51) Int. Cl.
*C01F 7/00* (2006.01)
*C23C 16/44* (2006.01)

(52) U.S. Cl.
CPC ............ *C23C 16/4405* (2013.01); *Y02C 20/30* (2013.01)
USPC .............................. 423/111; 423/335; 134/37

(58) Field of Classification Search
CPC ............................ C23C 16/4405; Y02C 20/30
USPC ..................... 423/335, 111; 134/37
See application file for complete search history.

(56) References Cited

U.S. PATENT DOCUMENTS 5,507,639 A 4/1996 Monoe
5,728,602 A 3/1998 Bellows et al.
(Continued)

FOREIGN PATENT DOCUMENTS

CN 1223462 7/1999
JP 2002-313787 10/2002
WO 2007/026762 3/2007

OTHER PUBLICATIONS

English translation of Tanahashi (JP2002-313787).*
(Continued)

*Primary Examiner* — Jun Li
(74) *Attorney, Agent, or Firm* — Smith, Gambrell & Russell, LLP.

(57) ABSTRACT

A method for using a heat processing apparatus of a batch type includes performing a preparatory process for removing aluminum present as a metal impurity from a quartz inner surface of a process container, and performing a main heat process on product substrates held on a holder member in the process container after the preparatory process. The preparatory process includes placing a plurality of dummy substrates for allowing the metal impurity to be deposited thereon inside a process container with no product substrates placed therein; then, supplying a chlorine-containing gas and water vapor into the process container and heating the quartz inner surface of the process container at a process temperature, thereby applying a baking process onto the quartz inner surface to discharge the metal impurity from the quartz inner surface and deposit the metal impurity onto the dummy substrates; and then, unloading the dummy substrates with the metal impurity deposited thereon from the reaction container.

16 Claims, 7 Drawing Sheets

(56) References Cited

U.S. PATENT DOCUMENTS

| | | |
|---|---|---|
| 5,749,723 A | 5/1998 | Okase |
| 6,413,874 B1 | 7/2002 | Sato |
| 6,639,312 B2 | 10/2003 | Herner et al. |
| 7,060,622 B2 * | 6/2006 | Miyamori et al. ............ 438/697 |
| 7,217,670 B2 | 5/2007 | van Kesteren |
| 7,691,208 B2 | 4/2010 | Maekawa |
| 8,569,175 B2 * | 10/2013 | Reber et al. .................. 438/706 |
| 2002/0102857 A1 | 8/2002 | Sato |
| 2007/0298621 A1 | 12/2007 | Anbai et al. |
| 2009/0133715 A1 | 5/2009 | Maekawa |
| 2010/0180918 A1 | 7/2010 | Maekawa |

OTHER PUBLICATIONS

Chinese Office Action issued on Feb. 23, 2011 for Chinese Application No. 200810168649.9 w/ Partial English translation.

Korean Office Action issued on Jun. 2, 2011 for Application No. 10-2008-0077961 w/ Partial English translation.

Chinese Office Action mailed Apr. 18, 2012 in CN 200810168649.9 (with English translation).

* cited by examiner

METHOD FOR REMOVING METAL IMPURITY FROM QUARTZ COMPONENT PART USED IN HEAT PROCESSING APPARATUS OF BATCH TYPE

This application is a continuation of U.S. patent application Ser. No. 12/222,241, filed 5 Aug. 2008, now abandoned, and claims the benefit of JP 2007-210241, filed 10 Aug. 2007, both of which are herein incorporated by reference in their entirety.

BACKGROUND OF THE INVENTION

1. Field of the Invention

The present invention relates to a method for removing a metal impurity, such as aluminum, from a quartz component part used in a heat processing apparatus of the batch type for performing a heat process on target substrates, such as semiconductor wafers, and particularly to a technique utilized in the semiconductor process field. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

As a heat processing apparatus used for performing a process for manufacturing semiconductor devices, there is a vertical heat processing apparatus, which is a heat processing apparatus of the batch type. A vertical heat processing apparatus of this kind includes a heating furnace formed of a vertical reaction container opened at the bottom and a heater surrounding the reaction container. A number of semiconductor wafers (which will be referred to as wafers) are supported at intervals in the vertical direction on a wafer holder called a wafer boat. The wafers supported on the wafer boat are loaded into the reaction container from below, and are subjected to a heat process, such as oxidation, diffusion, or film formation using CVD (Chemical Vapor Deposition).

In a vertical heat processing apparatus of this kind, some of the component parts, such as a reaction container, a wafer boat, and a heat-insulating unit (heat-keeping unit), are typically made of quartz. However, in general, quartz products originally contain metal impurities, such as aluminum, which can be discharged when the products are heated. Accordingly, in the case of a vertical heat processing apparatus, when the quartz component parts are heated inside the reaction container, metal impurities are scattered into the heated atmosphere inside the reaction container and may be partly deposited on wafers being processed.

In recent years, as the film thickness and the size of semiconductor devices are being smaller, a conventionally negligible amount of metal impurities, such as aluminum, deposited on wafers can deteriorate characteristics of semiconductor devices. Accordingly, it is required to provide techniques for preventing contamination of wafers due to metal impurities, such as aluminum.

Patent Document 1 (Jpn. Pat. Appln. KOKAI Publication No. 2002-313787: paragraphs 0017 to 0018) discloses a technique for removing copper from the surface of a quartz component part, such as a reaction container. According to this technique, before a heat processing apparatus is used for performing a heat process on product wafers, hydrogen chloride gas and oxygen gas are supplied into the reaction container set to have a heated atmosphere. However, as described later with reference to experimental results, the present inventors have found that aluminum removal is insufficient where the technique disclosed in Patent Document 1 is used.

BRIEF SUMMARY OF THE INVENTION

An object of the present invention is to provide a method for removing a metal impurity, such as aluminum, from a quartz component part used in a heat processing apparatus of the batch type for performing a heat process on target substrates, such as semiconductor wafers.

According to a first aspect of the present invention, there is provided a method for removing a metal impurity from a quartz component part in a heat processing apparatus of a batch type, the apparatus comprising a process container configured to accommodate a plurality of target substrates at intervals in a vertical direction and to form a heat process atmosphere therein, the process container including a quartz inner surface to be exposed to the heat process atmosphere, a heater configured to heat an interior of the process container, an exhaust system configured to exhaust gas from inside the process container, and a process gas supply system configured to supply a process gas into the process container, the method comprising: placing a plurality of dummy substrates for allowing the metal impurity to be deposited thereon inside the process container with no product target substrates placed therein; then, supplying a chlorine-containing gas and water vapor into the process container and heating the quartz inner surface of the process container at a process temperature, thereby applying a baking process onto the quartz inner surface to discharge the metal impurity from the quartz inner surface and deposit the metal impurity onto the dummy substrates; and then, unloading the dummy substrates with the metal impurity deposited thereon from the reaction container.

According to a second aspect of the present invention, there is provided a method for removing a metal impurity from a quartz component part in a heat processing apparatus of a batch type, the apparatus comprising a process container configured to accommodate a plurality of target substrates at intervals in a vertical direction and to form a heat process atmosphere therein, a predetermined member including a quartz portion to be exposed to the heat process atmosphere, a heater configured to heat an interior of the process container, an exhaust system configured to exhaust gas from inside the process container, and a process gas supply system configured to supply a process gas into the process container, the method comprising: placing the predetermined member along with a plurality of dummy substrates for allowing the metal impurity to be deposited thereon inside the process container with no product target substrates placed therein; then, supplying a chlorine-containing gas and water vapor into the process container and heating the quartz portion of the predetermined member at a process temperature, thereby applying a baking process onto the quartz portion to discharge the metal impurity from the quartz portion and deposit the metal impurity onto the dummy substrates; and then, unloading the dummy substrates with the metal impurity deposited thereon from the reaction container.

According to a third aspect of the present invention, there is provided a method for removing a metal impurity from a holder member configured to hold a plurality of target substrates at intervals in a vertical direction and including a quartz portion, in a heat processing apparatus of a batch type, the method comprising: placing the holder member holding a plurality of dummy substrates for allowing the metal impurity to be deposited thereon inside a process container with no product target substrates placed therein; then, supplying a chlorine-containing gas and water vapor into the process container and heating the quartz portion of the holder member at a process temperature, thereby applying a baking process onto the quartz portion to discharge the metal impurity from the quartz portion and deposit the metal impurity onto the dummy substrates; and then, unloading the holder member along with the dummy substrates with the metal impurity deposited thereon from the reaction container.

Each of the method described above may be performed at a stage when the component part has not yet been used for a heat process on semiconductor substrates or a stage when metal contamination on semiconductor substrates has been found. It should be noted that "the stage when the component part has not yet been used for a heat process on semiconductor substrates" includes a stage between a maintenance operation for the apparatus and a restart operation for a heat process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described with reference to the accompanying drawings. In the following description, the constituent elements having substantially the same function and arrangement are denoted by the same reference numerals, and a repetitive description will be made only when necessary.

Figure 1:
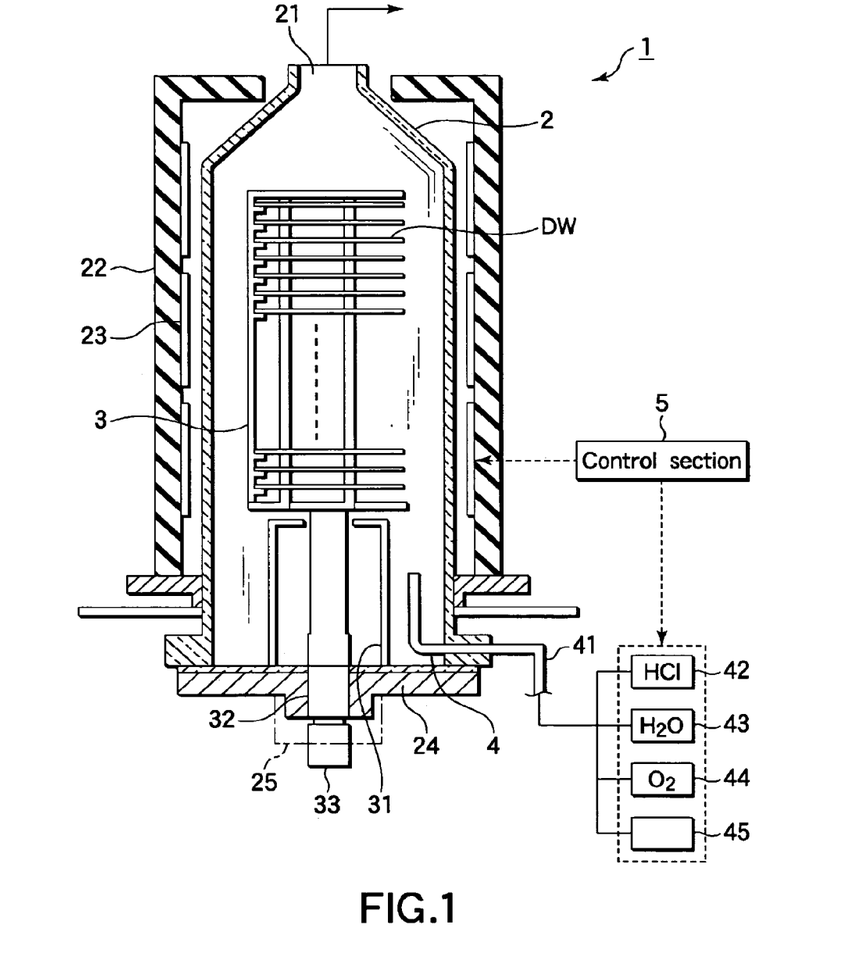
FIG. 1 is a sectional view showing a vertical heat processing apparatus according to an embodiment of the present invention.

FIG. 1 is a sectional view showing a vertical heat processing apparatus according to an embodiment of the present invention. A baking method according to an embodiment of the present invention is arranged to perform baking of quartz component parts while utilizing functions (such as a gas supply function and a heating function) provided in this vertical heat processing apparatus 1 for performing a process for manufacturing semiconductor devices. At first, an explanation will be given of the basic structure of the vertical heat processing apparatus 1.

As shown in FIG. 1, the apparatus 1 includes a cylindrical reaction container 2 made of quartz, which has an opening at the bottom and an exhaust port 21 at the top. The reaction container 2 is surrounded by a cylindrical casing 22 provided with a heating device or heater 23 disposed on the inner surface thereof. For example, the heater 23 comprises carbon wire heaters formed of woven bundles of high-purity carbon fibers and set to extend in the vertical direction.

A lid 24 having an upper surface covered with a quartz plate is disposed below the reaction container 2 to be moved up and down by a boat elevator 25 of an elevating mechanism, so that the opening of the reaction container 2 is opened and closed. The lid 24 is configured to support thereon a wafer boat 3 used as a holder for holding a plurality of, such as 100, wafers at intervals in the vertical direction. When the lid 24 is moved up and down, the wafer boat 3 is loaded and unloaded to and from the reaction container 2. A rotary shaft 23 is disposed below the wafer boat 3 and extends through a heat-insulating unit 31. The rotary shaft 32 is configured to be rotated by a rotary driving unit 33, so that the wafer boat 3 can be rotated by the rotary driving unit 33 as a whole.

An injector 4 is disposed near the bottom of the reaction container 2 and extends upward. The injector 4 is used for supplying a process gas into the reaction container 2 when a heat process is performed on the wafers. The upstream side of the injector 4 extends outside from the reaction container 2 and forms a gas passage 41 divided into a plurality of branch lines, one of which is connected to a process gas supply unit 45. In order to supply various process gases in accordance with the type of heat processes performed inside the reaction container 2, the process gas supply unit 45 includes a plurality of sets of a process gas source, a mass-flow controller for controlling the flow rate of the process gas, and a valve, although FIG. 1 shows them as a block for the sake of convenience. Further, the process gas supply unit 45 can supply purge nitrogen gas into the reaction container 2 before baking is started, as described later.

The vertical heat processing apparatus 1 includes a control section 5 for controlling operations of the heater 23 and process gas supply unit 45 described above. The control section 5 is formed of a computer (not shown) comprising a CPU and a memory that stores programs and so forth. Each of the programs contains a group of steps (commands) for controlling operations necessary for performing a heat process on the wafers or baking described later in the vertical heat processing apparatus 1. For example, these operations include control of the temperature of the heater 23, adjustment of the pressure inside the reaction container 2, and adjustment of the flow rate of a process gas or baking gas supplied into the reaction container 2. The programs are stored in a storage medium, such as a hard disk, compact disk, magnetic optical disk, or memory card, and are installed therefrom into the computer.

For example, in the vertical heat processing apparatus 1 having the structure described above, the wafer boat 3 with a number of wafers supported thereon is loaded into the reaction container 2, and the reaction container 2 is set to have a heated vacuum atmosphere. Then, a process gas is supplied from the process gas supply unit 45 into the reaction container 2 to perform a heat process for forming a predetermined film on the surface of the wafers.

In the vertical heat processing apparatus 1 described above, the reaction container 2 and wafer boat 3, which are component parts of the vertical heat processing apparatus 1, are made of quartz, i.e., they are quartz component parts. As explained in BACKGROUND OF THE INVENTION, metals, such as aluminum, titanium, and copper, are present on and/or in the surface of the quartz component parts, and may be deposited on wafers during a heat process and thereby deteriorate characteristics of semiconductor devices. In light of this problem, the vertical heat processing apparatus 1 according to this embodiment includes the function of performing baking for removing these metals from the surfaces of the wafer boat 3 and reaction container 2 at a stage when the quartz component parts have not yet been used for a heat process on wafers or a stage when metal contamination due to the metals has been found. The structure of the apparatus concerning the baking function will be explained below.

In relation to the baking function, the vertical heat processing apparatus 1 includes a hydrogen chloride gas supply unit 42 and a water vapor supply unit 43 for supplying a chlorine-containing gas, such as hydrogen chloride gas, and water vapor through the injector 4 into the reaction container 2. The hydrogen chloride gas supply unit 42 and water vapor supply unit 43 include a hydrogen chloride gas source, a water vapor source, mass-flow controllers, and valves, and are connected to branch lines on the upstream side of the gas passage 41, as in the process gas supply unit 45. For example, the hydrogen chloride gas is supplied from a hydrogen chloride gas source formed of a gas cylinder filled with hydrogen chloride gas in a high concentration. On the other hand, for example, the water vapor is supplied from a water vapor source of the catalyst type in which hydrogen gas and oxygen gas are heated and brought into contact with each other under the presence of a catalyst to generate water vapor. Alternatively, the water vapor source may be of the combustion type in which oxygen gas and hydrogen gas are combusted to generate water vapor. Alternatively, the water vapor source may be of the vaporizer type in which water is vaporized to generate water vapor. According to the catalyst type or combustion type, water vapor is generated under conditions richer in oxygen gas relative to the stoichiometric ratio, and so oxygen gas is contained in the water vapor thus generated by this type. Further, the gas passage 41 is connected to an oxygen gas supply unit 44 including an oxygen cylinder, a mass-flow controller, and so forth. The oxygen cylinder is used for supplying purge oxygen gas into the reaction container 2 after the baking of the quartz component parts (such as the reaction container 2 and wafer boat 3) is finished.

Figure 2:
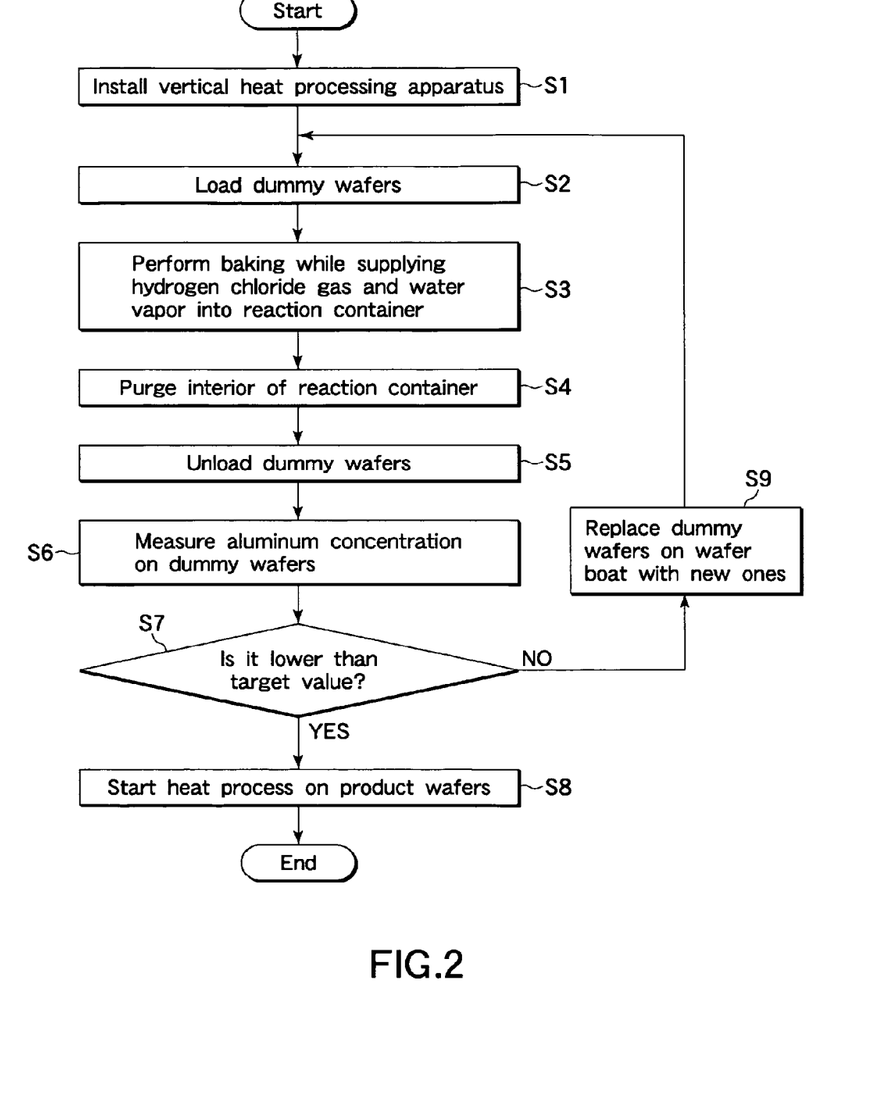
FIG. 2 is a flow chart showing the process flow of a method for baking a quartz component part according to an embodiment of the present invention.

Next, with reference to the flow chart of FIG. 2, an explanation will be given of steps of baking of the quartz component parts (such as the reaction container 2 and wafer boat 3), i.e., component parts of the vertical heat processing apparatus 1, performed in the vertical heat processing apparatus 1. The flow chart of FIG. 2 shows steps of baking performed at a stage when the quartz component parts have not yet been used for a heat process on wafers. For example, this stage appears after component parts of the vertical heat processing apparatus 1 manufactured in a maker are delivered into a semiconductor device factory, and then the vertical heat processing apparatus 1 is assembled in the semiconductor device factory.

It is assumed that the vertical heat processing apparatus 1 is installed in the semiconductor manufacturing factory (step S1), and is going to start running from now. Quartz component parts, such as the reaction container 2 and wafer boat 3 employed in the vertical heat processing apparatus 1 contain aluminum therein, and thus a baking process is performed thereon as follows before they are used for product wafers. At first, dummy wafers DW made of silicon are placed on the wafer boat 3, wherein the number of dummy wafers DW is typically the same as that of wafers in a heat process, such as 100. Then, the lid 24 is moved up, so that the dummy wafers DW are loaded into the reaction container 2, and the bottom opening of the reaction container 2 is closed by the lid 24 to set the reaction container 2 in an airtight sate (step S2).

Then, nitrogen is supplied at a predetermined flow rate from the process gas supply unit 45 into the reaction container 2 to perform nitrogen gas purge inside the reaction container 2. Further, the output to the heater 23 is controlled to raise the temperature inside the reaction container 2. Then, on the basis of detected values obtained by a temperature detector (not shown), such as a thermocouple, it is confirmed that the temperature inside the reaction container 2 reaches a baking temperature of, e.g., 550° C. or more and 1,200° C. or less, and preferably 1,050° C. or less, such as 750° C. Then, while the pressure inside the reaction container 2 is maintained at atmospheric pressure, the hydrogen chloride gas set at a flow rate of, e.g., 0.1 to 3.0 L/min and the water vapor set at a flow rate of, 5.0 to 10 L/min are supplied to perform the baking of the quartz component parts 2 and 3 (step S3). The ratio of the hydrogen chloride gas relative to the all the gases (hydrogen chloride gas+water vapor) supplied to the reaction container 2 is set to be, e.g., 0.5 to 30 vol %, such as 10 vol %. If the concentration of the hydrogen chloride gas exceeds 30 vol %, corrosion of the apparatus may be undesirably caused.

When the gases are supplied into the reaction container 2, metals, such as aluminum, present on and in the inner surface of the reaction container 2 and the surface of the wafer boat 3 react with hydrogen chloride and are turned into chlorides, such as aluminum chloride, and they also react with water vapor and are turned into hydroxides, such as aluminum hydroxide (hereinafter, these chlorides and hydroxides are collectively called metal compounds). The metal compounds thus generated are scattered from the quartz surface into the atmosphere inside the reaction container 2, and are partly exhausted along with the baking gas (hydrogen chloride gas and water vapor) from the exhaust port 21 through an exhaust passage (not shown) out of the reaction container 2.

As regards copper discussed in Patent Document 1, after it is scattered from the quartz component parts into the atmosphere inside the reaction container 2, it is exhausted outside without being re-deposited on the quartz component parts (a trace amount of copper may be re-deposited). However, it has been found that aluminum is re-deposited on the quartz component parts. According to this embodiment, since a number of dummy wafers DW are placed inside the reaction container 2, aluminum scattered into the atmosphere inside the reaction container 2 is deposited on the dummy wafers DW. Then, aluminum bonds to silicon used as the material of the dummy wafers DW and thus can hardly be scattered again into the atmosphere. Accordingly, aluminum scattered from the quartz component parts into the atmosphere inside the reaction container 2 is sequentially trapped by the dummy wafers DW.

After the baking of the quartz component parts 2 and 3 is performed as described above for a predetermined time, such as 30 minutes to 1 hour, supply of the hydrogen chloride gas and water vapor is stopped. Alternatively, oxygen gas is supplied from the oxygen gas supply unit 44 into the reaction container 2 while gas is exhausted from the reaction container 2 to perform oxygen gas purge for, e.g., 30 minutes to 1 hour (step S4). With this purge, the hydrogen chloride gas and water vapor are exhausted, so that a corrosion atmosphere is prevented from being formed inside the reaction container 2. Where the vertical heat processing apparatus 1 is of the type that performs a heat process under a vacuum atmosphere, the oxygen gas purge described above may be performed after a vacuum atmosphere is formed inside the reaction container 2, so that the hydrogen chloride gas, which is a corrosion factor, is reliably exhausted.

Thereafter, supply of the oxygen gas is stopped, and nitrogen gas is supplied into the reaction container 2 to perform nitrogen gas purge, while the reaction container 2 is cooled by, e.g., natural cooling to a predetermined temperature of from room temperature to 100° C. Then, the lid 24 is moved down, so that the wafer boat 3 is unloaded from the reaction container 2 (step S5). Then, sample dummy wafers DW are picked up, and the concentration of an objective metal, such as aluminum, on the sample dummy wafers DW is measured by, e.g., an ICP-MS (Inductively Coupled Plasma-Mass Spectrometry) (step S6). Then, if the measured aluminum concentration is higher than a target value (step S7; N), the dummy wafers DW on the wafer boat 3 are replaced with new dummy wafers DW (step S9). Then, the new dummy wafers DW are loaded into the reaction container 2, and the baking and the measurement of the aluminum concentration on the dummy wafers DW are performed again (step S2 to S7).

On the other hand, when the aluminum concentration on the dummy wafers DW becomes lower than the target value (step S7; Y), product wafers for manufacturing semiconductor devices are placed on the wafer boat 3 in place of the dummy wafers DW. Then, an ordinary heat process starts being performed on the product wafers (step S8). As described above, the baking of the quartz component parts 2 and 3 is performed.

The baking method according to the embodiment described above provides the following effects. Specifically, in general, aluminum scattered from quartz component parts, such as the reaction container 2 and wafer boat 3, can be easily re-deposited on the quartz component parts. However, since the baking is performed with a number of dummy wafers DW placed inside the baking atmosphere, scattered aluminum is trapped by the dummy wafers DW, and so the amount of aluminum inside the quartz component parts is decreased. Consequently, when a heat process is performed on product wafers thereafter, aluminum contamination on the wafers can be suppressed.

Further, where the baking is repeated while dummy wafers DW inside the reaction container 2 are replaced with new ones, the quartz component parts 2 and 3 are prevented from being contaminated by aluminum scattered from the dummy wafers DW, and aluminum is reliably removed from inside the vertical heat processing apparatus 1. Further, after the baking, the concentration of aluminum deposited on some of the dummy wafers DW unloaded from the reaction container 2 is measured, and this measurement result is used to make a judgment of whether or not the baking needs to be performed again with new dummy wafers DW. Consequently, the aluminum concentration in the quartz component parts can be reliably decreased, while dummy wafers DW are prevented from being unnecessary consumed.

In the embodiment described above, the chlorine-containing gas supplied along with water vapor into the reaction container 2 is exemplified by hydrogen chloride gas. In place of this gas, the chlorine-containing gas may be another gas, such as chlorine gas or an organic chlorine compound, e.g., trans-dichloroethylene.

As described previously, the timing for performing the baking of the quartz component parts 2 and 3 is not limited to a timing after the vertical heat processing apparatus 1 is assembled. For example, the concentration of aluminum deposited on heat-processed wafers may be periodically measured, so that, when the measurement result is found to exceed a set value, an ordinary heat process for wafers is temporarily stopped and the step S2 to step S9 shown in FIG. 2 are performed. In this embodiment, the objective metal, which may cause contamination on wafers, is exemplified aluminum. In place of aluminum, the objective metal may be another metal, such as titanium that is originally contained in quartz component parts by an amount next largest to aluminum.

Further, a quartz component part, from which a metal, such as aluminum, is removed, is not limited to the reaction container 2 or wafer boat 3 explained with reference to the flow chart of FIG. 2. For example, the quartz plate covering the upper surface of the lid 24 and the heat-insulating unit 31 are also such quartz component parts used as component parts of the vertical heat processing apparatus 1.

The vertical heat processing apparatus 1 assembled from quartz component parts may be exemplified by an oxidation furnace for oxidizing a silicon film, a diffusion furnace for diffusing an impurity into a semiconductor layer, and a CVD furnace.

Figure 3:
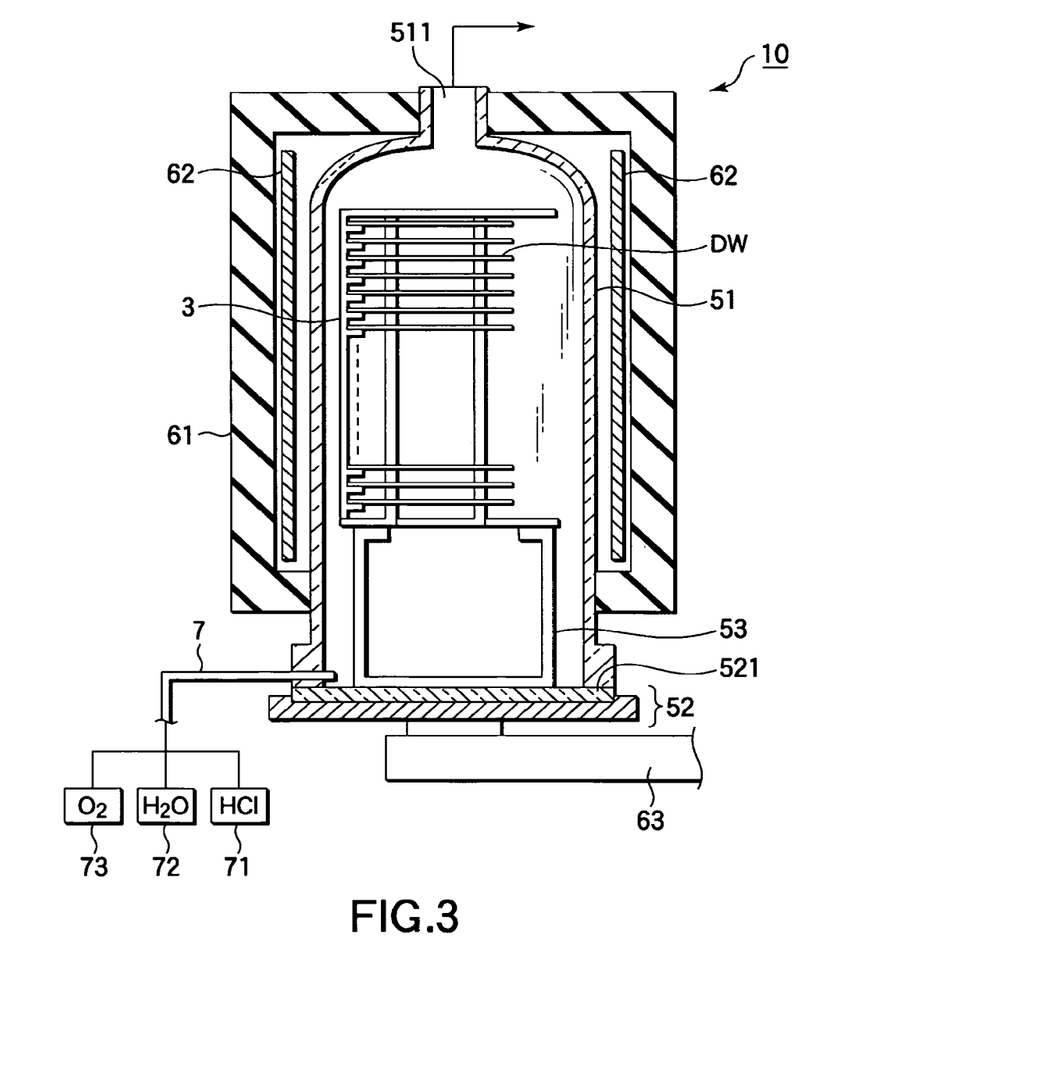
FIG. 3 is a sectional view showing a baking apparatus according to another embodiment of the present invention.

In the embodiment described above, the baking of the quartz component parts are performed after the vertical heat processing apparatus 1 is assembled. However, baking of a quartz component part may be performed before the quartz component part is used to assemble the vertical heat processing apparatus 1. FIG. 3 is a view showing a baking apparatus 10 for removing metals present on and in the wafer boat 3 (a quartz component part) before the wafer boat 3 is incorporated into the vertical heat processing apparatus 1.

The baking apparatus 10 has a structure similar to that of the vertical heat processing apparatus 1. Specifically, the baking apparatus 10 includes a quartz reaction container 51 having an exhaust port 511 at the top, a lid 52 having an upper surface covered with a quartz plate 521, and a support member 53 for holding the wafer boat 3 to be baked. Further, the baking apparatus 10 includes a casing 61, a heater 62, and an elevator 63 for moving the lid 52 up and down. A gas supply line 7 is disposed and connected at its upstream side to a hydrogen chloride gas supply unit 71, a water vapor supply unit 72, and an oxygen gas supply unit 73.

The baking is performed by use of, e.g., steps S2 to S7 and S9 after the wafer boat 3 is manufactured by a maker and before it is incorporated into the vertical heat processing apparatus 1. Specifically, the wafer boat 3 with dummy wafers DW supported thereon is loaded into the reaction container 51, and the heating, exhaust, and gas supply are performed as described above to execute the baking. Then, the concentration of metals on the dummy wafers DW is measured, and this measurement result is used to make a judgment of whether or not the baking needs to be performed again with new dummy wafers DW. As needed, the baking is repeated, so that the wafer boat 3 is free from metals, such as aluminum.

Present Example

Experiment 1

An experiment was conducted to examine the relationship between the type of a gas used for baking of a quartz component part and the effect of removing aluminum from the quartz component part.

A. Experiment Conditions

In the vertical heat processing apparatus 1 shown in FIG. 1, three dummy wafers DW were respectively placed at the top, center, and bottom of the wafer boat 3. Then, baking of quartz component parts (such as the reaction container 2 and wafer boat 3) was performed while different gases were respectively supplied and the interior of the reaction container 2 was heated at 750° C. After the baking was performed for a predetermined time, the concentration of aluminum deposited on the dummy wafers DW was measured by an ICP-MS.

Under the experiment conditions described above, different gases set out below were respectively supplied into the reaction container 2.

Present Example PE1

Hydrogen chloride gas: 0.6 L/min
Water vapor: 10 L/min

Comparative Example CE1

Oxygen gas: 10 L/min

Comparative Example CE2

Water vapor: 10 L/min

Comparative Example CE3

Hydrogen chloride gas: 0.6 L/min
Oxygen gas: 10 L/min

B. Experimental Results

Figure 4:
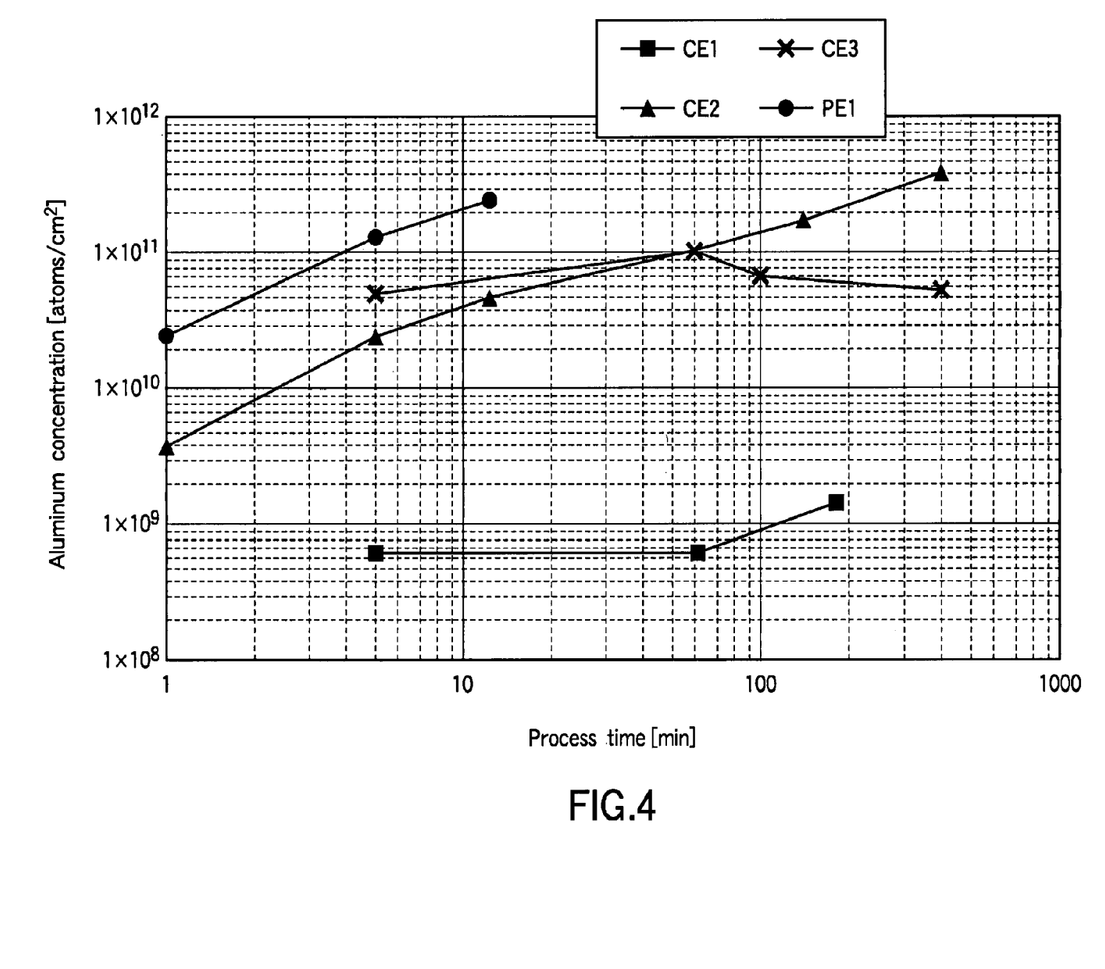
FIG. 4 is a characteristic diagram showing a metal removing effect of the baking method, obtained by an experiment performed in the apparatus shown in FIG. 1.

FIG. 4 shows the atomic concentration of aluminum on the surface of the dummy wafer DW placed at the bottom of the wafer boat 3 after the predetermined time had elapsed, in the present example and comparative examples described above. In FIG. 4, the horizontal axis denotes the heating time [min] and the vertical axis denotes the aluminum concentration [atoms/cm$^2$] by logarithm. In FIG. 4, "●" represents the present example PE1, "■" represents the comparative example CE1, "▲" represents the comparative example CE2, and "x" represents the comparative example CE3. Aluminum deposited on the dummy wafers DW originates from aluminum present on and in quartz component parts inside the reaction container 2. Accordingly, as the amount of aluminum deposited on the dummy wafers DW is larger (the atomic concentration of aluminum is higher), the effect of removing aluminum from the quartz component parts is higher.

According to the results shown in FIG. 4, where the water vapor and hydrogen chloride gas were simultaneously supplied (the present example PE1), the effect of removing aluminum was the highest even with a short process time of ten and several minutes. On the other hand, where the oxygen gas was solely supplied (the comparative example CE1), the effect was merely about one hundredth of that of the present example PE1 at a process time of, e.g., 5 minutes. Where the water vapor was solely supplied (the comparative example CE2), a process time of about 400 minutes was required to obtain the same effect of removing aluminum as that of the present example PE1. Where the oxygen gas and hydrogen chloride gas were supplied (the comparative example CE3), the effect of removing aluminum could not be comparable to that of the present example PE1 even with a longer process time. Accordingly, it has been found that a method of simultaneously supplying the chlorine-containing gas and water vapor to perform baking is the most effective as a method for removing aluminum from a quartz component part.

Experiment 2

An experiment was conducted to examine the relationship between the type of a gas used for baking of a quartz component part and the amount of aluminum deposited on product wafers.

A. Experiment Conditions

In the vertical heat processing apparatus 1 shown in FIG. 1, a gas was supplied into the reaction container 2 while the interior of the container 2 was heated to perform baking. Thereafter, wafers were loaded into the reaction container 2 and subjected to a heat process. This sequence was repeatedly performed. The concentration of aluminum deposited on the wafers during the heat process was measured. In the baking of this experiment, no dummy wafers DW were placed inside the reaction container 2.

Comparative Example CE4

One cycle of baking was arranged to solely supply water vapor at 10 L/min into the reaction container 2 and heat the interior of the reaction container 2 at 1,000° C. for 6 hours. Then, the first to tenth cycles of baking were repeatedly performed. Wafers were loaded into the reaction container 2 and subjected to a heat process before the first cycle of baking was started and after each cycle of baking was performed. The concentration of aluminum deposited on the wafers during the heat process was measured. The seventh and eighth cycles of baking were continuously performed for 12 hours without a heat process performed on wafers between these cycles.

Present Example PE2

One cycle of baking was arranged to supply water vapor at 10 L/min and hydrogen chloride gas at 0.6 L/min into the reaction container 2 and heat the interior of the reaction container 2 at 1,000° C. for 1 hour. Then, the first to second cycles of baking were performed after the heat process of the tenth cycle of the comparative example CE4. As in the comparative example CE4, a heat process was performed on wafers after each cycle of baking was performed. The concentration of aluminum deposited on the wafers during the heat process was measured.

B. Experimental Results

Figure 5:
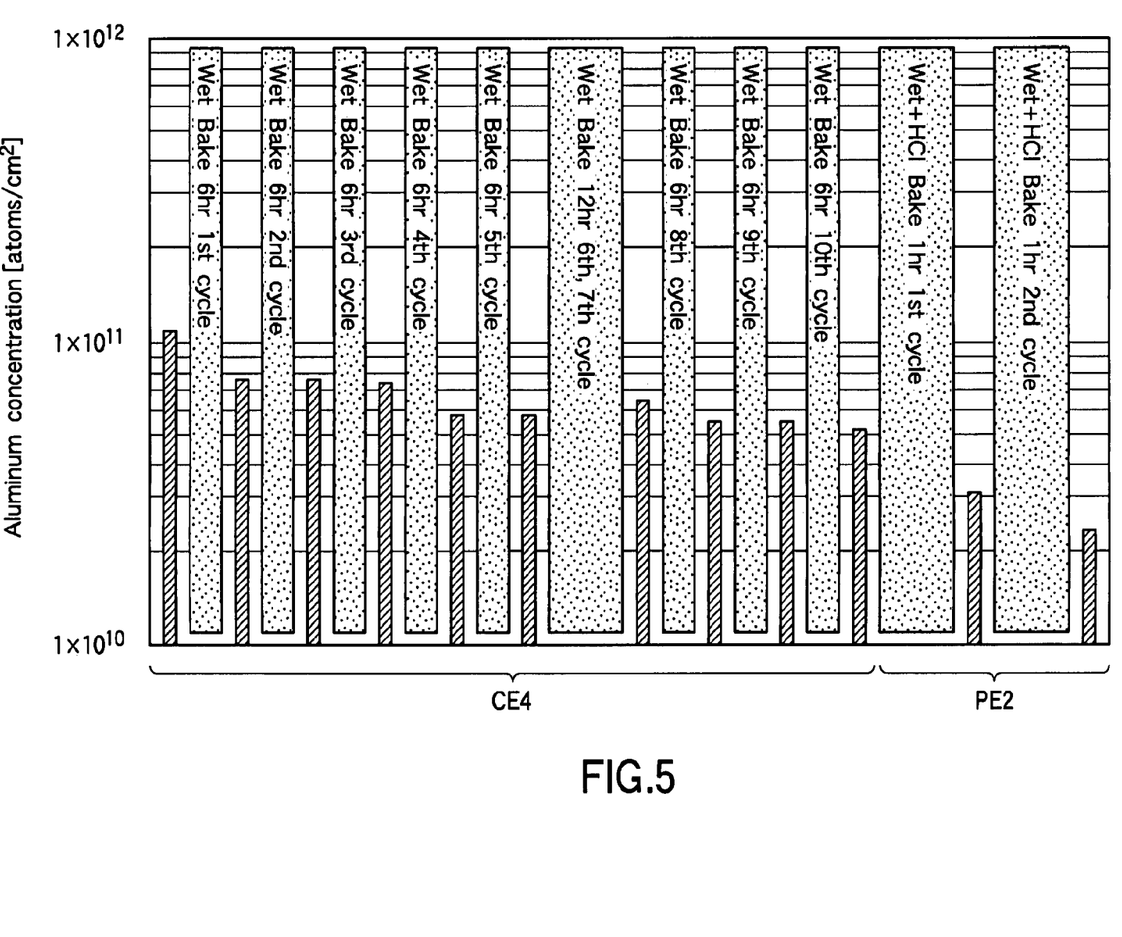
FIG. 5 is a second characteristic diagram showing a metal removing effect of the baking method, obtained by an experiment performed in the apparatus shown in FIG. 1.

FIG. 5 shows the concentration of aluminum deposited on the wafers heat-processed before start of baking and after each cycle of baking in the comparative example CE4 and present example PE2. According to the result of the comparative example CE4, even 10 cycles, i.e., the baking for totally 60 hours, merely decreased the concentration of aluminum deposited on the wafers to a half (about 5.0×10$^{10}$ atoms/cm$^2$) of that (about 1.0×10$^{11}$ atoms/cm$^2$) obtained before start of baking. Further, looking at the concentration of aluminum deposited during each heat process after the fourth to tenth cycles, the aluminum concentration was almost unchanged even where the number of cycles of baking was increased, i.e., the baking effect was not exhibited.

On the other hand, according to the two cycles of baking of the present example PE2, the aluminum concentration bottomed out by the tenth cycle of the comparative example CE4 was further nearly halved and decreased to one fifth (about 2.0×10$^{10}$ atoms/cm$^2$) of that (about 1.0×10$^{11}$ atoms/cm$^2$) obtained before start of baking. Accordingly, also from these results, it has been found that a method of simultaneously supplying the chlorine-containing gas and water vapor to perform baking is the most effective as a method for removing aluminum from a quartz component part.

Experiment 3

An experiment was conducted to examine the effect of removing aluminum, provided by baking with dummy wafers DW placed inside the reaction container 2.

A. Experiment Conditions

In the vertical heat processing apparatus 1 shown in FIG. 1, baking was performed while the number of dummy wafers DW was set at different values. Thereafter, wafers were loaded into the reaction container 2 and subjected to a heat process. The concentration of aluminum deposited on the wafers during the heat process was measured. In the baking of this experiment, the temperature inside the reaction container 2 was set at 1,000° C. and the baking time was set at 60 minutes. Trans-dichloroethylene used as a chlorine-containing gas was supplied at 0.6 L/min and water vapor was supplied at 10 L/min both into the reaction container 2. In order to confirm reproducibility, the same experiment was performed twice.

Present Examples PE3-1 AND PE3-2

Number of dummy wafers: 100

Present Examples PE4-1 AND PE4-2

Number of dummy wafers: 50

Comparative Examples CE5-1 AND CE5-2

Number of dummy wafers: 0

B. Experimental Results

Figure 6:
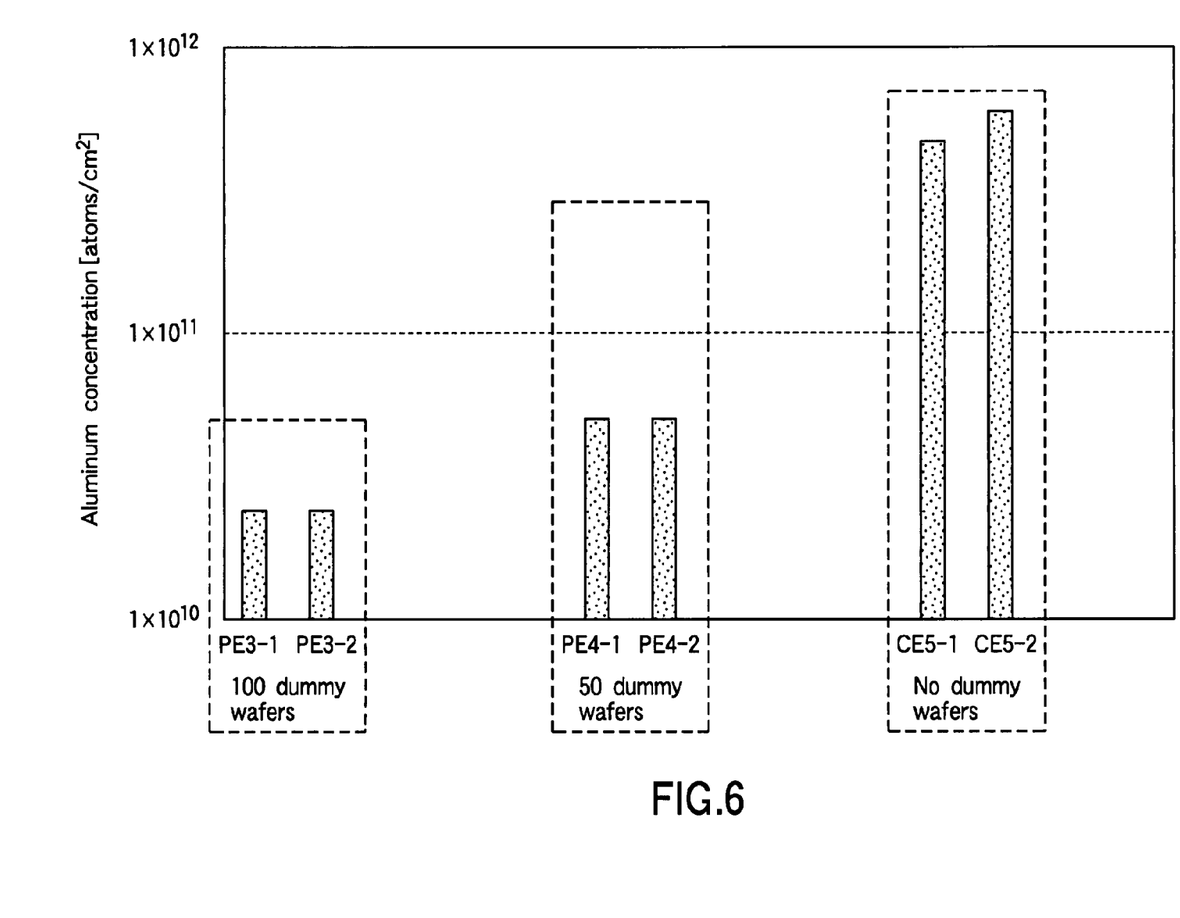
FIG. 6 is a third characteristic diagram showing a metal removing effect of the baking method, obtained by an experiment performed in the apparatus shown in FIG. 1.

FIG. 6 shows measurement results of the concentration of aluminum deposited on the wafers during the heat process performed thereon after the baking was performed under the conditions of each of the present examples and comparative examples. According to the experimental results, where the baking was performed by use of dummy wafers DW (the present examples PE3-1 and PE3-2 and the present examples PE4-1 and PE4-2), the amount of aluminum deposited on the wafers during the heat process subsequent to the baking was smaller than those obtained by a case where no dummy wafers DW were used (the comparative examples CE5-1 and CE5-2). Further, in comparison with the present examples each other, the examples with a larger number of dummy wafers (the present examples PE3-1 and PE3-2) rendered a smaller amount of deposited aluminum than the examples with a smaller number of dummy wafers (the present examples PE4-1 and PE4-2). Accordingly, it has been found that, as the number of dummy wafers DW placed inside reaction container 2 during the baking is increased, the effect of removing aluminum is enhanced. In this experiment, trans-dichloroethylene was used as a chlorine-containing gas and was found to provide a sufficient effect of removing aluminum.

Experiment 4

An experiment was conducted to examine the influence of a change in the temperature inside the reaction container 2 on the effect of removing aluminum.

A. Experiment Conditions

In the vertical heat processing apparatus 1 shown in FIG. 1, a gas (hydrogen chloride gas set at 0.6 L/min and water vapor set at 10 L/min) was supplied into the reaction container 2 while the interior of the container 2 was heated to perform baking for 10 hours. Thereafter, three wafers were respectively placed at the top, center, and bottom of the wafer boat 3 and subjected to a heat process. The concentration of aluminum deposited on the wafers during the heat process was measured. In the baking of this experiment, no dummy wafers DW were placed inside the reaction container 2.

Present Example PE5

Temperature inside reaction container: 550° C.

Present Example PE6

Temperature inside reaction container: 700° C.

Comparative Example CE6

Heat process was performed on wafers inside reaction container not processed by baking.

B. Experimental Results

Figure 7:
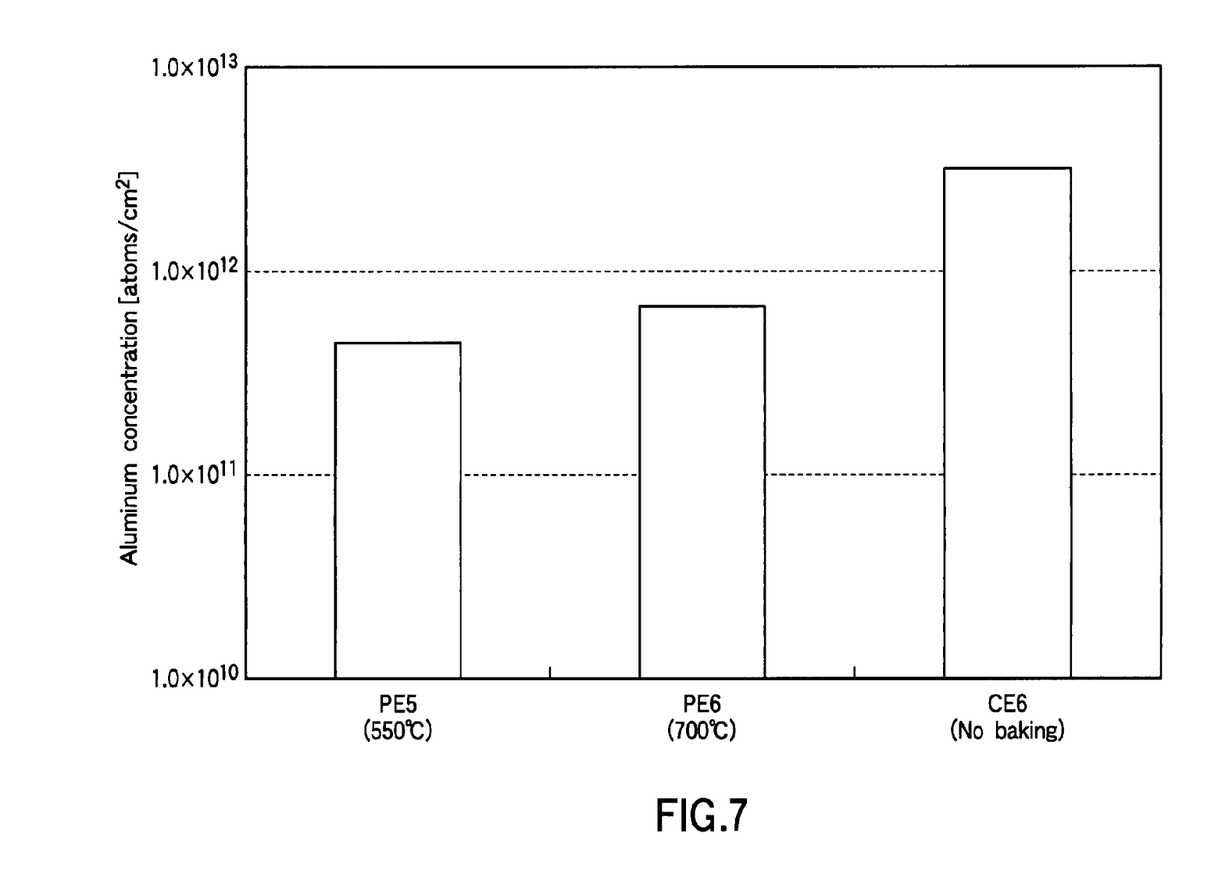
FIG. 7 is a characteristic diagram showing an influence of a temperature change in the baking method, obtained by an experiment performed in the apparatus shown in FIG. 1.

FIG. 7 is a characteristic diagram showing an influence of a change in the temperature inside the reaction container, obtained by this experiment. According to the experimental results, where the reaction container 2 processed by baking was used (the present examples PE5 and PE6), the concentration of aluminum deposited on the wafers during the heat process 2 was smaller than that obtained by the reaction container not processed by baking. Accordingly, these present examples exhibited a sufficient effect of removing aluminum from quartz component parts. On the other hand, in comparison with present examples PE5 and PE6 each other, a lower temperature inside the reaction container 2 (the present example PE5) rendered a better effect of removing aluminum than a higher temperature (the present example PE6). However, if the temperature inside the reaction container 2 is too low, such as a temperature of far lower than 500° C., corrosion of the apparatus may be undesirably caused due to condensation of hydrochloric acid or the like. On the other hand, this temperature is set to be 1,200° C. or less, and preferably 1,050° C., in light of the heat resistance of quartz component parts.

According to the embodiments of the present invention described above, baking of a quartz component part is performed inside a heated atmosphere with a number of dummy substrates placed therein, while a chlorine-containing gas and water vapor are supplied. A metal scattered by the baking is deposited on the dummy substrates, which are then unloaded from the reaction container. In this case, the metal thus scattered is prevented from being re-deposited on the quartz component part. Consequently, a heat process can be performed on semiconductor substrates by use of the quartz component part with a very small amount of metal present thereon, so that metal contamination on the semiconductor substrates is remarkably suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a heat processing apparatus of a batch type, the apparatus comprising:
  a holder member configured to hold a plurality of product substrates, on which semiconductor devices are to be formed, at intervals in a vertical direction,
  a process container configured to accommodate the holder member with the product substrates held thereon and to form a heat process atmosphere therein, the process container including a quartz inner surface to be exposed to the heat process atmosphere, a heater configured to heat an interior of the process container, an exhaust system configured to exhaust gas from inside the process container, a process gas supply system configured to supply into the process container a process gas for performing a main heat process to form the semiconductor devices, and a removal gas supply system configured to supply into the process container a gas for performing a removal process to remove aluminum, present as a metal impurity, from quartz, and the method comprising:

performing the removal process for removing aluminum present as a metal impurity from the quartz inner surface of the process container in the process container with no product substrates placed therein, and performing the main heat process on the product substrates held on the holder member in the process container after the removal process, wherein the removal process comprises:
performing a loading operation by holding a plurality of dummy substrates including a silicon surface, to which aluminum generated in the removal process is to bond, on the holder member and placing the holder member with the dummy substrates held thereon inside the process container;

then, performing a baking treatment by supplying hydrogen chloride gas and water vapor from the removal gas supply system into the process container, with the dummy substrates kept placed therein, while setting a ratio of the hydrogen chloride gas relative to a sum total of the hydrogen chloride gas and the water vapor at 0.5 to 30 vol %, and heating the quartz inner surface of the process container at a process temperature of 550° C. to 700° C., thereby applying the baking treatment onto the quartz inner surface to discharge aluminum from the quartz inner surface and deposit aluminum thus discharged onto the dummy substrates such that aluminum bonds to the silicon surface, the baking treatment being performed for 30 minutes to 1 hour;

then, performing an oxygen gas purge by stopping supply of the hydrogen chloride gas and the water vapor, and supplying oxygen gas from the removal gas supply system into the process container, with the dummy substrates kept placed therein, to remove residues of the hydrogen chloride gas and the water valor from inside the process container, the oxygen gas purge being performed for 30 minutes to 1 hour;

then, performing an unloading preparation by stopping supply of the oxygen gas and purging the interior of the process container, with the dummy substrates kept placed therein, with nitrogen gas while cooling the process container to an unload temperature;

then, performing an unloading operation by unloading the holder member along with the dummy substrates with aluminum deposited thereon from the process container, without performing the main heat process on the dummy substrates; and then, performing a measuring operation by measuring a concentration of aluminum deposited on at least one of the dummy substrates thus unloaded, and wherein the removal process repeats the loading operation, the baking treatment, the oxygen gas purge, the unloading preparation, the unloading operation, and the measuring operation in the foregoing order, while replacing the dummy substrates with new ones every time after the measuring operation, until the concentration becomes lower than a predetermined value, before performing the main heat process on the product substrates in the process container.

2. The method according to claim 1, wherein the holder member includes a quartz portion, and the removal process includes applying the baking treatment also onto the quartz portion of the holder member to discharge aluminum from the quartz portion.

3. The method according to claim 1, wherein the apparatus comprises a predetermined member including a quartz portion to be exposed to the heat process atmosphere, and the removal process includes placing the predetermined member along with the holder member with the dummy substrates held thereon inside the process container, and applying the baking treatment also onto the quartz portion of the predetermined member to discharge aluminum from the quartz portion.

4. The method according to claim 1, where the main heat process is oxidation, diffusion, or CVD process.

5. The method according to claim 1, where the main heat process is performed under a vacuum atmosphere, and the oxygen gas purge is performed after a vacuum atmosphere is formed inside the process container.

6. The method according to claim 1, wherein the baking treatment is performed by supplying the hydrogen chloride gas and the water vapor into the process container having an inner pressure set at atmospheric pressure.

7. The method according to claim 1, wherein the unload temperature is a temperature of from room temperature to 100° C.

8. A method for using a heat processing apparatus of a batch type, the apparatus comprising:
a holder member configured to hold a plurality of product substrates, on which semiconductor devices are to be formed, at intervals in a vertical direction, a process container configured to accommodate the holder member with the product substrates held thereon and to form a heat process atmosphere therein, a predetermined member including a quartz portion to be exposed to the heat process atmosphere, a heater configured to heat an interior of the process container, an exhaust system configured to exhaust gas from inside the process container, a process gas supply system configured to supply into the process container a process gas for performing a main heat process to form the semiconductor devices, and a removal gas supply system configured to supply into the process container a gas for performing a removal process to remove aluminum, present as a metal impurity, from quartz, and the method comprising:
performing the removal process for removing aluminum present as a metal impurity from the quartz portion of the predetermined member in the process container with no product substrates placed therein, and performing the main heat process on the product substrates held on the holder member in the process container after the removal process, wherein the removal process comprises:

performing a holding operation by holding a plurality of dummy substrates including a silicon surface, to which aluminum generated in the removal process is to bond, on the holder member and placing the holder member with the dummy substrates held thereon inside the process container;

then, performing a baking treatment by supplying hydrogen chloride gas and water vapor from the removal gas supply system into the process container, with the dummy substrates kept placed therein, while setting a ratio of the hydrogen chloride gas relative to a sum total of the hydrogen chloride gas and the water vapor at 0.5 to 30 vol %, and heating the quartz portion of the predetermined member at a process temperature of 550° C. to 700° C., thereby applying the baking treatment onto the quartz portion to discharge aluminum from the quartz inner surface and deposit aluminum thus discharged onto the dummy substrates such that aluminum bonds to the silicon surface, the baking treatment being performed for 30 minutes to 1 hour;

then, performing an oxygen gas purge by stopping supply of the hydrogen chloride gas and the water vapor and supplying oxygen gas from the removal gas supply system into the process container, with the dummy substrates kept placed therein, to remove residues of the hydrogen chloride gas and the water vapor from inside the process container, the oxygen gas purge being performed for 30 minutes to 1 hour;

then, performing an unloading operation by stopping supply of the oxygen gas and purging the interior of the process container, with the dummy substrates kept placed therein, with nitrogen gas while cooling the process container to an unload temperature;

then, performing an unloading operation by unloading the holder member along with the dummy substrates with aluminum deposited thereon from the process container, without performing the main heat process on the dummy substrates; and then, performing a measuring operation by measuring a concentration of aluminum deposited on at least one of the dummy substrates thus unloaded, and wherein the removal process repeats the loading operation, the baking treatment, the oxygen gas purge, the unloading preparation, the unloading operation, and the measuring operation in the foregoing order, while replacing the dummy substrates with new ones every time after the measuring operation until the concentration becomes lower than a predetermined value before performing the main heat process on the product substrates by use of the predetermined member.

9. The method according to claim 8, where the main heat process is oxidation, diffusion, or CVD process.

10. The method according to claim 8, where the main heat process is performed under a vacuum atmosphere, and the oxygen gas purge is performed after a vacuum atmosphere is formed inside the process container.

11. The method according to claim 8, wherein the baking treatment is performed by supplying the hydrogen chloride gas and the water vapor into the process container having an inner pressure set at atmospheric pressure.

12. The method according to claim 8, wherein the unload temperature is a temperature of from room temperature to 100° C.

13. A method for removing aluminum present as a metal impurity from a holder member configured to hold a plurality of product substrates, on which semiconductor devices are to be formed in a heat processing apparatus of a batch type, at intervals in a vertical direction and including a quartz portion, the method being performed in a baking apparatus dedicated to the holder member and different from the heat processing apparatus of a batch type, the baking apparatus comprising:

a process container configured to accommodate the holder member and to form a heat process atmosphere therein, a heater configured to heat an interior of the process container, an exhaust system configured to exhaust gas from inside the process container, and a removal gas supply system configured to supply into the process container a gas for performing a removal process to remove aluminum, present as a metal impurity, from quartz, the method comprising:

performing the removal process in the process container with no product substrates placed therein before performing a main heat process to form the semiconductor devices on the product substrates by use of the holder member, wherein the removal process comprises:

performing a loading operation by holding a plurality of dummy substrates including a silicon surface, to which aluminum generated in the removal process is to bond, on the holder member and placing the holder member with the dummy substrates held thereon inside the process container;

then, performing a baking treatment by supplying hydrogen chloride gas and water vapor from the removal gas supply system into the process container, with the dummy substrates kept placed therein, while setting a ratio of the hydrogen chloride gas relative to a sum total of the hydrogen chloride gas and the water vapor at 0.5 to 30 vol %, and heating the quartz portion of the holder member at a process temperature of 550° C. to 700° C., thereby applying the baking treatment onto the quartz portion to discharge aluminum from the quartz inner surface and deposit aluminum thus discharged onto the dummy substrates such that aluminum bonds to the silicon surface, the baking treatment being performed for 30 minutes to 1 hour;

then, performing an oxygen gas purge by stopping supply of the hydrogen chloride gas and the water vapor and supplying oxygen gas from the removal gas supply system into the process container, with the dummy substrates kept placed therein, to remove residues of the hydrogen chloride gas and the water vapor from inside the process container, the oxygen gas purge being performed for 30 minutes to 1 hour;

then, performing an unloading preparation by stopping supply of the oxygen gas and purging the interior of the process container, with the dummy substrates kept placed therein, with nitrogen gas while cooling the process container to an unload temperature;

then, performing an unloading operation by unloading the holder member along with the dummy substrates with aluminum deposited thereon from the process container, without performing the main heat process on the dummy substrates; and then, performing a measuring operation by measuring a concentration of aluminum deposited on at least one of the dummy substrates thus unloaded, and wherein the removal process repeats the loading operation, the baking treatment, the oxygen gas purge, the unloading preparation, the unloading operation, and the measuring operation in the foregoing order, while replacing the dummy substrates with new ones every time after the measuring operation until the concentration becomes lower than a predetermined value before performing the main heat process on the product substrates by use of the holder member.

14. The method according to claim 13, where the main heat process is performed under a vacuum atmosphere, and the oxygen gas purge is performed after a vacuum atmosphere is formed inside the process container.

15. The method according to claim 13, wherein the baking treatment is performed by supplying the hydrogen chloride gas and the water vapor into the process container having an inner pressure set at atmospheric pressure.

16. The method according to claim 13, wherein the unload temperature is a temperature of from room temperature to 100° C.

* * * * *